United States Patent
Lee et al.

(10) Patent No.: US 7,514,741 B2
(45) Date of Patent: Apr. 7, 2009

(54) NONVOLATILE SEMICONDUCTOR MEMORY DEVICE AND RELATED METHOD

(75) Inventors: Seung-Jun Lee, Suwon-si (KR); Dong-Gyun Han, Yongin-si (KR)

(73) Assignee: Samsung Electronics Co., Ltd., Suwon-si, Gyeonngi-do (KR)

( * ) Notice: Subject to any disclaimer, the term of this patent is extended or adjusted under 35 U.S.C. 154(b) by 9 days.

(21) Appl. No.: 11/491,194

(22) Filed: Jul. 24, 2006

(65) Prior Publication Data
US 2007/0023823 A1    Feb. 1, 2007

(30) Foreign Application Priority Data
Jul. 27, 2005    (KR) .................. 10-2005-0068566

(51) Int. Cl.
*H01L 27/115* (2006.01)
(52) U.S. Cl. ............................... 257/316; 257/E27.103
(58) Field of Classification Search ................ 257/213, 257/288, 314, 315, 316, E27.102, E27.103
See application file for complete search history.

(56) References Cited

U.S. PATENT DOCUMENTS

| | | | |
|---|---|---|---|
| 6,323,085 B1 * | 11/2001 | Sandhu et al. | 438/257 |
| 6,326,263 B1 * | 12/2001 | Hsieh | 438/257 |
| 6,768,161 B2 | 7/2004 | Kinoshita | |
| 2002/0102793 A1 * | 8/2002 | Wu | 438/257 |
| 2002/0179962 A1 * | 12/2002 | Kinoshita | 257/315 |
| 2004/0099900 A1 | 5/2004 | Iguchi et al. | |

FOREIGN PATENT DOCUMENTS

| | | |
|---|---|---|
| JP | 2002-359308 | 12/2002 |
| JP | 2004-172488 | 6/2004 |
| KR | 1020020092234 | 12/2002 |
| KR | 1020040025244 A | 3/2004 |
| KR | 1020040045313 | 6/2004 |
| KR | 1020050002021 A | 1/2005 |
| KR | 1020050029891 | 3/2005 |
| KR | 1020050029891 A | 3/2005 |

* cited by examiner

*Primary Examiner*—Evan Pert
*Assistant Examiner*—Kevin Quinto
(74) *Attorney, Agent, or Firm*—Volentine & Whitt, PLLC (57) ABSTRACT

A nonvolatile memory device and a method for fabricating the nonvolatile memory device are disclosed. The method comprises forming a device isolation pattern comprising a first opening and a second opening wider than the first opening, wherein the first opening is formed in the second opening; and forming a gate insulating layer on a first portion of an active region of the substrate, wherein the first opening exposes the first portion of the active region of the substrate. The method further comprises forming a first conductive layer in the first and second openings and on the gate insulating layer, partially etching the first conductive layer to form a U-shaped floating gate electrode, forming a gate interlayer insulating layer on the U-shaped floating gate electrode, forming a second conductive layer on the gate interlayer insulating layer and the device isolation pattern, and patterning the second conductive layer.

5 Claims, 10 Drawing Sheets

Fig. 1

(PRIOR ART)

NONVOLATILE SEMICONDUCTOR MEMORY DEVICE AND RELATED METHOD

BACKGROUND OF THE INVENTION

1. Field of the Invention

Embodiments of the invention relate to a semiconductor memory device. In particular, embodiments of the invention relate to a nonvolatile semiconductor memory device comprising a U-shaped floating gate electrode and a method for fabricating the nonvolatile semiconductor memory device.

This application claims priority to Korean Patent Application No. 10-2005-0068566, filed on Jul. 27, 2005, the subject matter of which is hereby incorporated by reference in its entirety.

2. Description of the Related Art

A semiconductor memory device is used for storing data and may be generally classified as either a volatile memory device or a nonvolatile memory device. Data may be written to and read from a volatile memory device while power is supplied to the volatile memory device, but stored data is lost when power is not supplied to the volatile memory device. However, a nonvolatile memory device may retain stored data even when power is not supplied to the device. Thus, nonvolatile memory devices are widely used in various other electronic devices, such as a memory cards used to store music or image files, in case power cannot be continuously supplied to the memory devices in those electronic devices.

Figure 1:
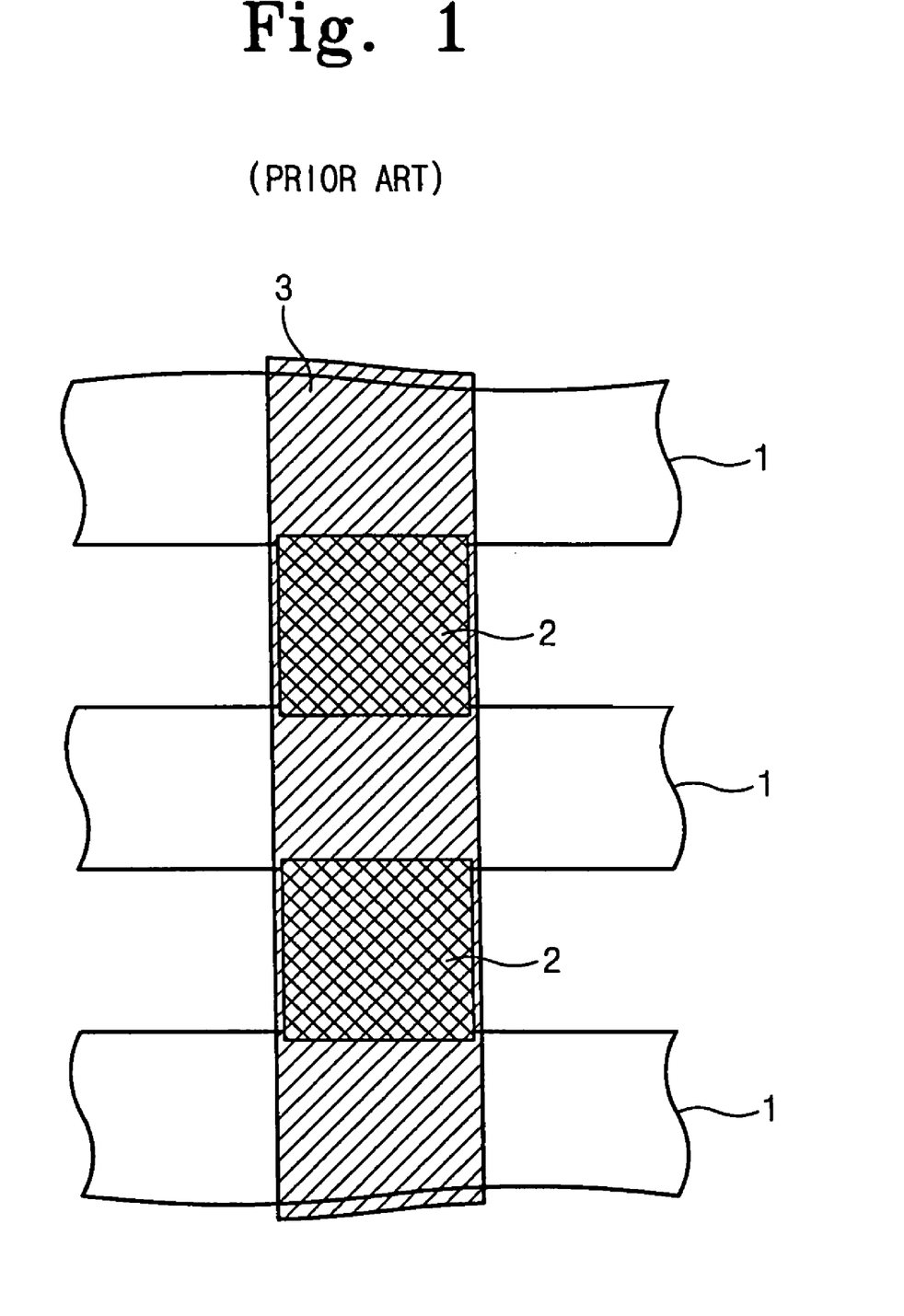
FIG. 1 is a plane view of a portion of a conventional nonvolatile semiconductor memory device.

FIG. (FIG.) 1 is a plane view of a portion of a conventional nonvolatile semiconductor memory device.

Referring to FIG. 1, device isolation patterns 1 disposed on the substrate are disposed adjacent to and on opposite sides of an active region of a substrate. A floating gate electrode 2 is formed on the active region between adjacent device isolation patterns 1, and a control gate electrode 3 is disposed over floating gate electrode 2. A gate insulating layer (not shown) is interposed between the substrate and floating gate electrode 2, and a gate interlayer insulating layer (not shown) is interposed between floating gate electrode 2 and control gate electrode 3.

Data is stored in floating gate electrode 2. That is, a memory cell stores a data value of logic "0" when charge is not stored in floating gate electrode 2, while the memory cell stores a data value of logic "1" when the charge is stored in floating gate electrode 2. Programming and erase operations are performed by applying operational voltages to control gate electrode 3. When an operational voltage is applied to control gate electrode 3, a predetermined voltage is induced on floating gate electrode 2. An electric field created by the induced voltage may cause charge to penetrate through the gate insulating layer by Fowler-Nordheim tunneling or hot carrier injection.

The ratio of the voltage induced on floating gate electrode 2 to the operational voltage applied to control gate electrode 3 is referred to as a coupling ratio. As the coupling ratio in a semiconductor memory device increases, the power consumption of the device may be reduced because the voltage level of the operational voltage can be reduced. One method for increasing the coupling ratio in a semiconductor memory device is increasing the capacitance between control gate electrode 3 and floating gate electrode 2. It may be possible to increase an surface area over which control gate electrode 3 and floating gate electrode 2 overlapped with one another in order to increase the capacitance between control gate electrode 3 and floating gate electrode 2. However, as semiconductor memory devices become more highly integrated, the opportunity to increase the surface area over which control gate electrode 3 and floating gate electrode 2 overlap is limited because of space restrictions within the semiconductor memory devices.

SUMMARY OF THE INVENTION

Embodiments of the invention provide a nonvolatile memory device in which the surface area over which a floating gate electrode and a control gate electrode overlap is increased, and a method for fabricating the nonvolatile memory device.

In one embodiment, the invention provides a method for fabricating a nonvolatile memory device that comprises forming a device isolation pattern protruding from a substrate and comprising a first opening and a second opening wider than the first opening, wherein the first opening is formed in the second opening; and forming a gate insulating layer on a first portion of an active region of the substrate, wherein the first opening exposes the first portion of the active region of the substrate. The method further comprises forming a first conductive layer in the first and second openings and on the gate insulating layer, partially etching the first conductive layer to form a U-shaped floating gate electrode, forming a gate interlayer insulating layer on the U-shaped floating gate electrode, forming a second conductive layer on the gate interlayer insulating layer and the device isolation pattern, and patterning the second conductive layer.

In another embodiment, the invention provides a nonvolatile memory device comprising a device isolation pattern disposed on a substrate and adjacent to an active region of the substrate, wherein the device isolation pattern protrudes from the substrate; a U-shaped floating gate electrode; a gate interlayer insulating layer formed on the U-shaped floating gate electrode; and a control gate electrode formed on the gate interlayer insulating layer and the device isolation pattern.

BRIEF DESCRIPTION OF THE DRAWINGS

Embodiments of the invention will be described herein with reference to the accompanying drawings, in which like reference symbols refer to like elements throughout. For purposes of clarity, elements in the drawings are not necessarily drawn to scale. In the drawings.

DESCRIPTION OF EMBODIMENTS

Figure 2A:
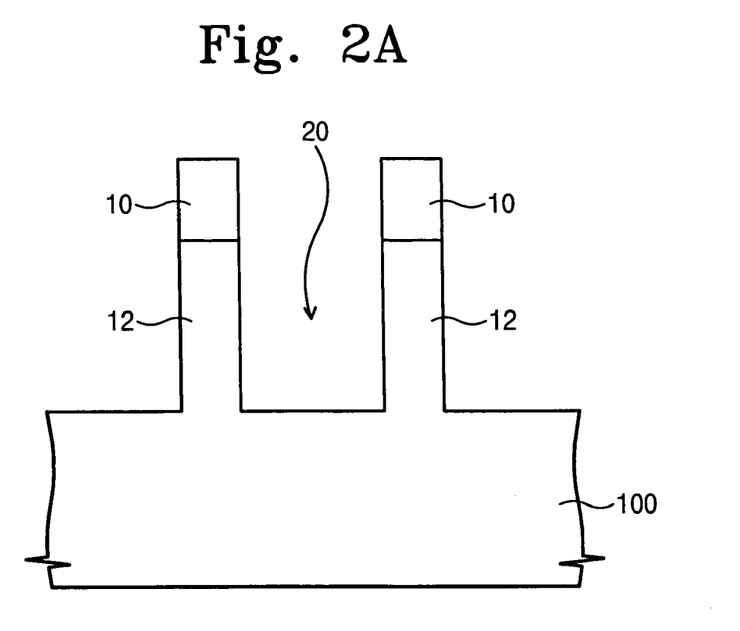
FIGS. 2A through 2K are cross-sectional views illustrating a method for fabricating a nonvolatile memory device in accordance with an embodiment of the invention.
Figure 2B:
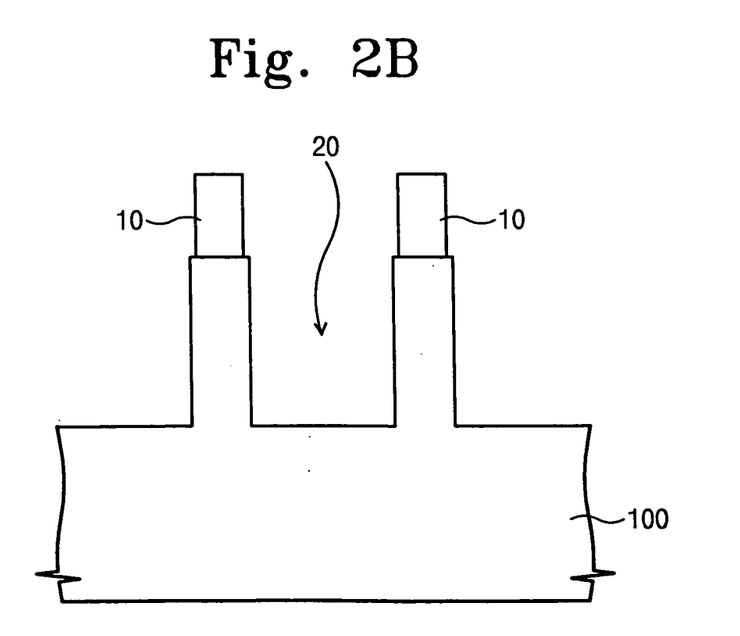
Figure 2C:
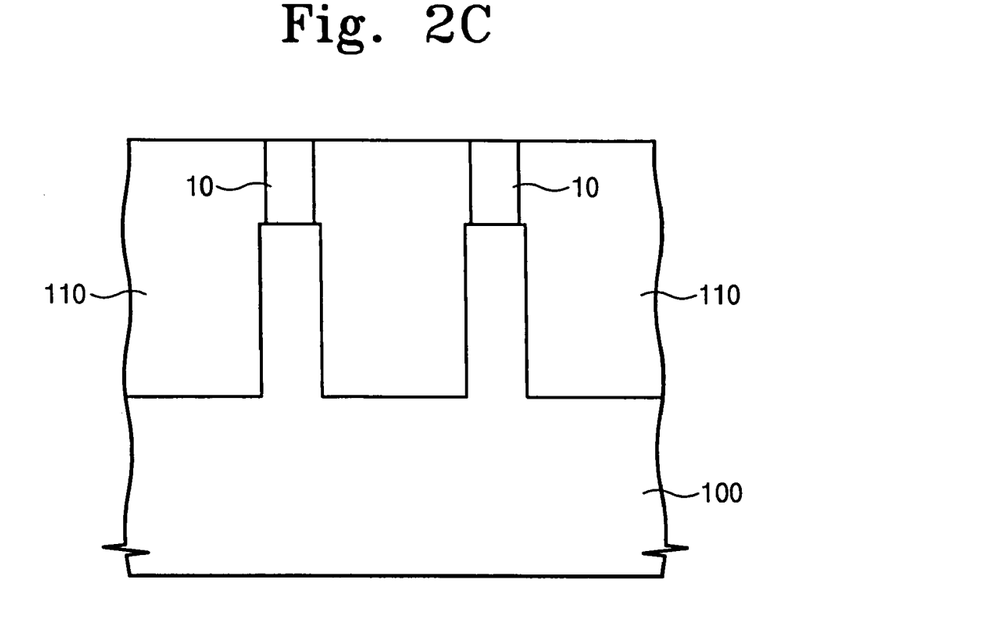
Figure 2D:
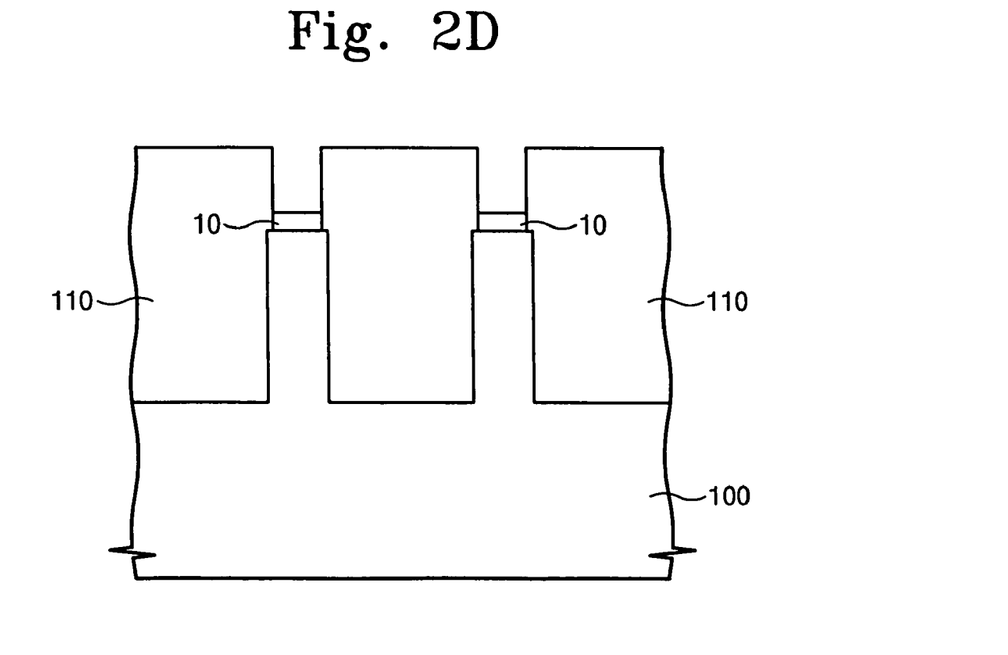
Figure 2E:
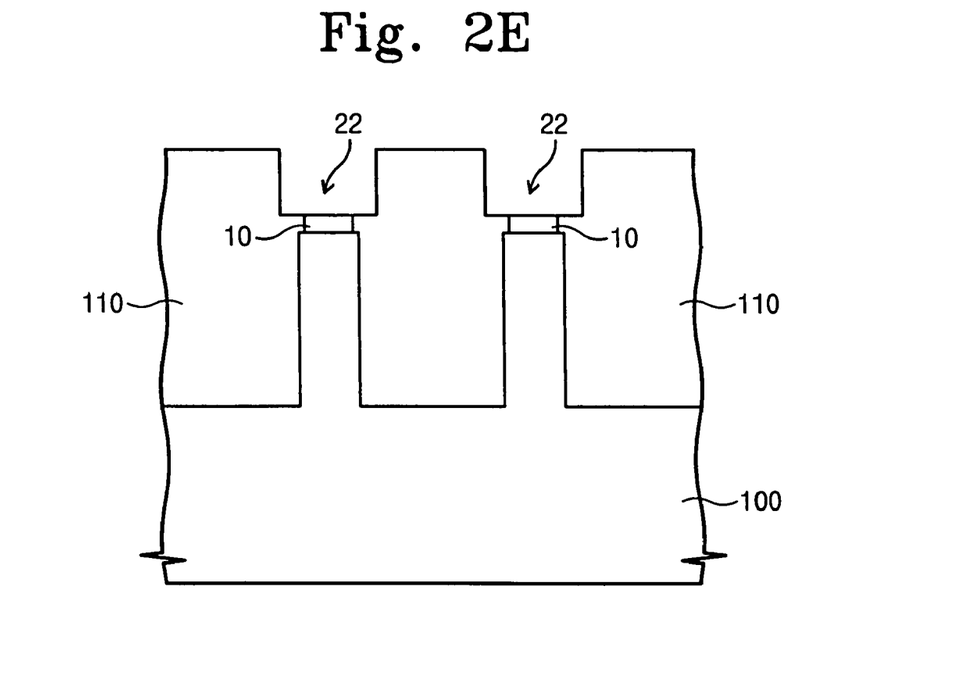
Figure 2F:
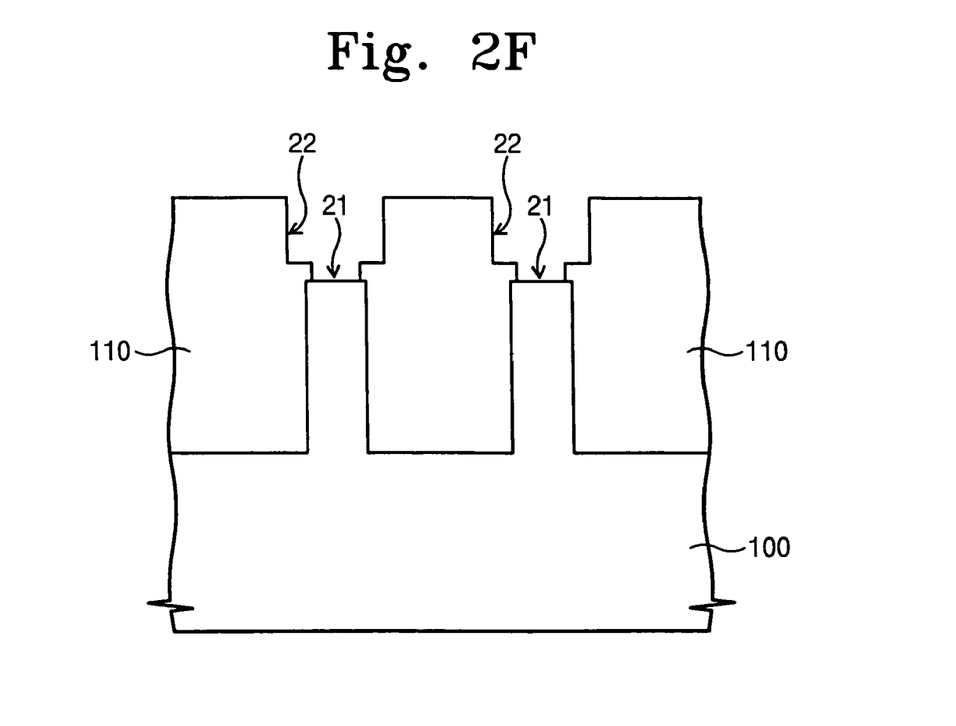
Figure 2G:
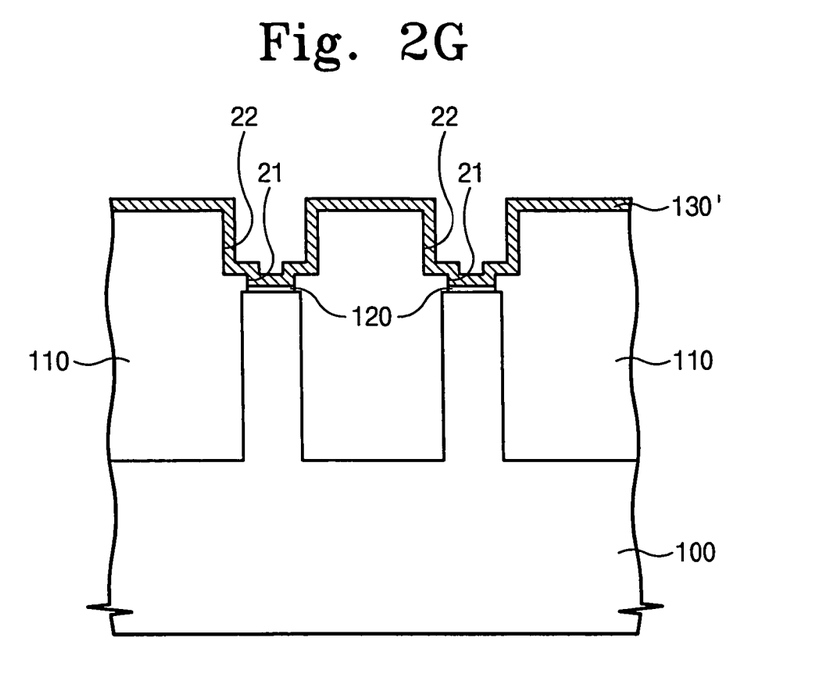
Figure 2H:
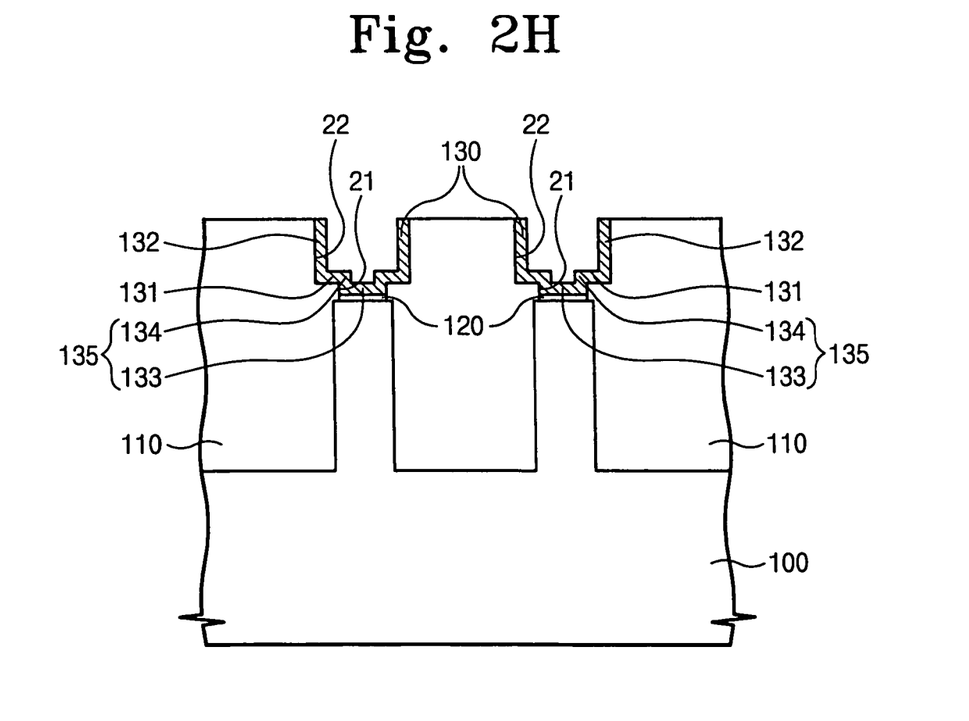
Figure 2I:
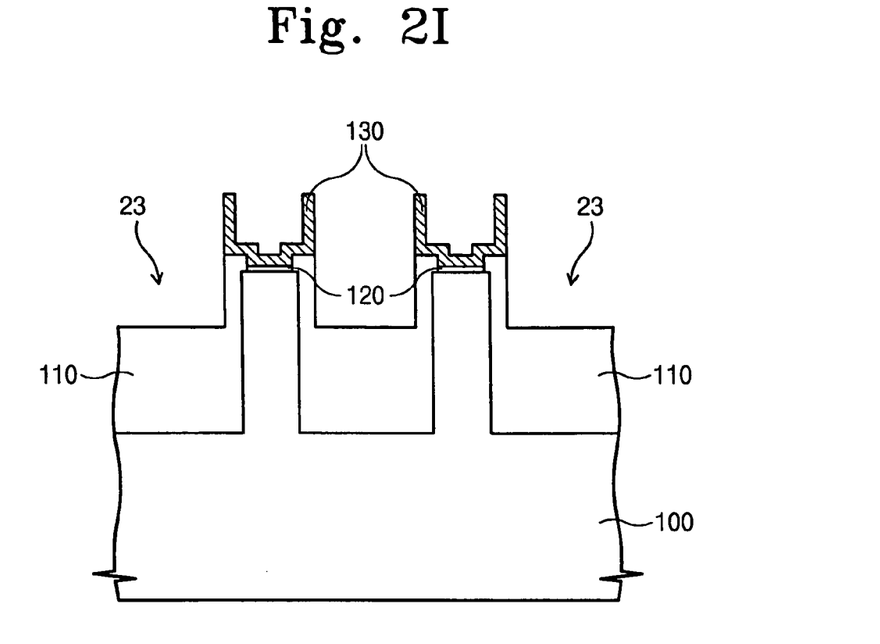
Figure 2J:
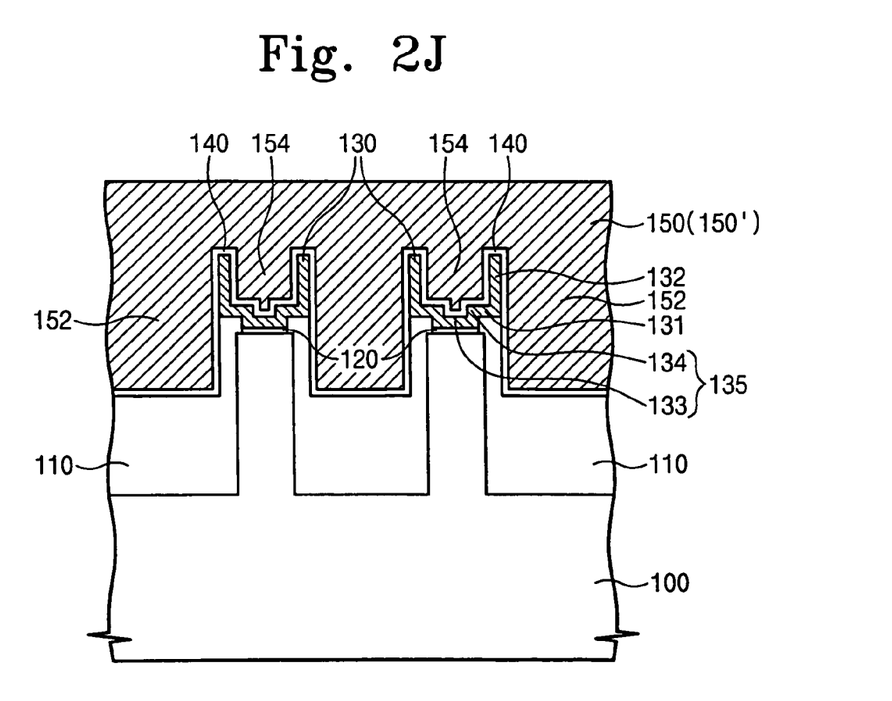
Figure 2K:
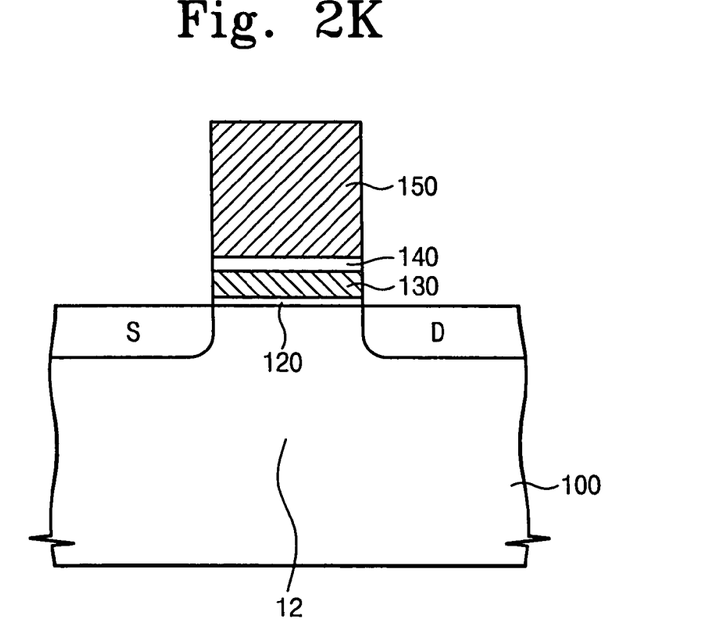

FIGS. 2A through 2K are cross-sectional views illustrating a method for fabricating a nonvolatile memory device in accordance with an embodiment of the invention. In particular, FIGS. 2A through 2J are cross-sectional views taken along a first direction, wherein the first direction is substantially parallel to the direction in which a control gate electrode 150 extends. In addition, FIG. 2K is a cross-sectional view taken along a third direction, wherein the third direction is substantially perpendicular to the direction in which control gate electrode 150 extends. The terms "first," "second," and "third" are only used herein for purposes of clarity of description. Also, as used herein, a "direction" may indicate either a positive or negative direction. Referring to FIG. 2A, for example, the second direction may be either "up" or "down" in the orientation of FIG. 2A.

Referring to FIG. 2A, hard masks 10 are formed on substrate 100. Hard masks 10 may be formed by, for example, patterning a nitride layer having an etch selectivity with respect to substrate 100. A pad oxide layer may be interposed between substrate 100 and hard masks 10. The pad oxide layer may contribute to relieving the stress inflicted on substrate 100 by hard masks 10. As used herein, when a first element or layer is said to be formed "on" a second element or layer, the first element or layer may be formed directly on the second element or layer, or one or more intervening elements or layers may be present.

Substrate 100 is then etched using hard masks 10 as an etching mask to form trenches 20. Trenches 20 may be formed through an anisotropic dry etching process, and an active region 12 of substrate 100 may be defined by adjacent trenches 20. The bottom surface of a trench 20 may be referred to herein as the lower surface of substrate 100. In addition, for clarity of description, though the drawings may illustrate a plurality of like elements (e.g., active regions 12) only one element of the plurality of like elements will generally be described herein (though more than one may also be described herein).

Referring to FIGS. 2A and 2B, hard mask 10 is etched to reduce the width and height of hard mask 10. When hard mask 10 is etched through a wet etching process, the width and height of hard mask 10 are reduced simultaneously. As used herein, the "width" of an element (or opening) is the distance in the first direction between the surfaces of the sidewalls of the element (or opening). Also as used herein, the "height" of an element (or opening) is the distance in a second direction between the top surface (or top) and the bottom surface of the element (or opening), wherein the second direction is substantially perpendicular to the upper surface of active region 12 (which may be referred to herein as the upper surface of substrate 100) and the lower surface of substrate 100 (i.e., the bottom surface of trench 20). The preceding process for wet-etching hard mask 10 is performed to indirectly adjust the width of a first opening 21, which will be formed subsequently (see FIG. 2F). Thus, the wet etching process is performed so that the width of hard mask 10 will correspond to the desired width of first opening 21. However, the desired width of first opening 21 may be equal to the width of hard mask 10 before it is etched. When the desired width of first opening 21 is equal to the width of hard mask 10 before it is etched, the process for etching hard mask 10 may be omitted.

Referring to FIGS. 2B and 2C, an insulating layer is formed over the resultant structure of FIG. 2B to fill trench 20, thereby forming a device isolation pattern 110. An undoped silicate glass (USG) layer, a tetra ethyl ortho silicate (TEOS) layer, or a high density plasma (HDP) oxide layer with an excellent gap-filling property may be used as the insulating layer. After filling trench 20 with the insulating layer, the insulating layer is planarized such that the top surface of the insulating layer is substantially level with a top surface of hard mask 10. As used herein, when two surfaces are said to be substantially "level" with one another, it means that each surface is disposed at a substantially equal distance in the second direction from the lower surface of substrate 100. The insulating layer may be planarized using a chemical mechanical polishing (CMP) process or an etch back process. During the planarization process, hard mask 10 is used as a stopper that acts as a reference point at which the planarization process stops.

Referring to FIGS. 2C and 2D, hard mask 10 is partially etched to reduce the height of hard mask 10 (i.e., a first portion of hard mask 10 is removed). The height of the remaining portion of hard mask 10 (i.e., the portion of hard mask 10 that remains after the etching process is performed) corresponds to the height of first opening 21, which will be formed in a subsequent process (see FIG. 2F). Hard mask 10 may be etched by performing a wet etching process using a predetermined solution having an etching selectivity with respect to an oxide layer. When the preceding isotropic (i.e., wet) etching process is performed, device isolation pattern 110 is not etched in the first direction because device isolation pattern 110 is formed from an oxide layer and the solution has an etching selectivity between hard mask 10 and the oxide layer. Therefore, hard mask 10 is only etched in the second direction, so only the height of hard mask 10 is reduced, while the width of hard mask 10 is not changed.

Referring to FIGS. 2D and 2E, device isolation pattern 110 is then etched to form a second opening 22. Device isolation pattern 110 may be etched by performing a wet etching process using a solution having an etch selectivity with respect to hard mask 10. As a result, a cavity region formed through the previously performed process of etching hard mask 10 is gradually enlarged in the first direction (i.e., widened) to form second opening 22. As illustrated in FIG. 2E, the width of second opening 22 is greater than the width of active region 12. A benefit of second opening 22 being wider than active region 12 will be set forth subsequently (see the descriptions with reference to FIG. 2J).

Referring to FIGS. 2E and 2F, the remaining portion of hard mask 10 is completely removed through an etching process to thereby form first opening 21, which exposes a portion of active region 12 of substrate 100. The remaining portion of hard mask 10 may be etched by performing a wet etching process using a solution having an etch selectivity with respect to the oxide layer (i.e., device isolation pattern 110, which is formed from the oxide layer). When the pad oxide layer is interposed between hard mask 10 and substrate 100, the pad oxide layer is also removed after hard mask 10 is removed in order to expose the portion of active region 12 of substrate 100 that is disposed under the remaining portion of hard mask 10 and the pad oxide layer. As illustrated in FIG. 2F, the width of second opening 22 is greater than the width of first opening 21.

Second opening 22 is formed by etching device isolation pattern 110. Device isolation pattern 110 may be etched by performing an isotropic etching process such as a wet etching process. When device isolation pattern 110 is etched by performing an isotropic etching process such as a wet etching process, device isolation pattern 110 is etched in the first direction and the second direction at the same time such that the width of second opening 22 becomes larger than first width 21. However, second opening 22 may be formed such that portions of device isolation pattern 110 disposed at bottom corners of second opening 22 are over-etched and, as a result, active region 12 disposed adjacent to the bottom corners of second opening 22 may be damaged, or a subsequently formed gate insulating layer 120 (see FIG. 2G) may be formed improperly.

In accordance with the embodiment illustrated in FIG. 2, however, since device isolation pattern 110 is etched after forming the cavity region by removing a portion of hard mask 10 (see FIGS. 2D and 2E), only relatively small portions of device isolation layer 110 are etched in the first direction to form second opening 22. Therefore, second opening 22 may be etched such that the bottom corners of second opening 22 are not over-etched, unlike when the entire width of second opening 22 is etched at one time.

However, even when two etching processes are performed in order to form second opening 22, the bottom corners of second opening 22 may be slightly over-etched when the cavity is widened to form second opening 22. However, problems caused by the over-etching of bottom corners of second opening 22 may be substantially resolved in the embodiment illustrated in FIG. 2 because first opening 21 is formed separately from second opening 22. That is, since first opening 21 is formed separately from and second opening, the bottom corners of second opening 22 can be separated in the second direction from the active region by a distance in the second direction that is equal to the height of first opening 21. As a result, it is possible to substantially protect active region 12 of substrate 100 and properly form gate insulating layer 120 on active region 12 regardless of whether bottom corners of second opening 22 have been over-etched.

Referring to FIGS. 2F and 2G, a gate insulating layer 120 is formed on the portion of active region 12 exposed by first opening 21. Gate insulating layer 120 may be formed from an oxide layer using a CVD process or a thermal oxidation process. Subsequently, a first conductive layer 130' is deposited on substrate 100, on which gate insulating layer 120 has been formed. First conductive layer 130', which will be used as a floating gate electrode, may be formed from doped polysilicon having a predetermined conductivity. First conductive layer 130' is conformally formed on the first bottom and first sidewalls of first opening 21, the second bottom and second sidewalls of second opening 22, and the exposed upper surface of device isolation pattern 110.

Referring to FIGS. 2G and 2H, portions of first conductive layer 130' are removed. That is, the portions of first conductive layer 130' that are formed on the upper surface of device isolation pattern 110 are removed, while the portion of first conductive layer 130' that is formed in first and second openings 21 and 22 is not etched. Thus, a U-shaped floating gate electrode 130 is formed by removing the portions of first conductive layer 130' that are formed on the upper surface of device isolation pattern 110. A CMP process or a similar process may be performed to remove the portions of first conductive layer 130' that are formed on the upper surface of device isolation pattern 110. Since first conductive layer 130' does not completely fill first and second openings 21 and 22, the CMP process may be performed after filling openings 21 and 22 with an insulating layer (not shown). As used herein, a "U-shaped floating gate electrode" is a floating gate electrode comprising a flat portion, sidewalls, and a lower portion, wherein the flat portion extends in the first direction, the sidewalls are connected to a first side of the flat portion and extend away from the flat portion in the second direction, and the lower portion is connected to a second side of the flat portion opposite the first side. U-shaped floating gate electrode 130 comprises a flat portion 131, sidewalls 132, and an inner U-shaped portion 135 as the lower portion. In addition, the inner U-shaped portion 135 comprises an inner flat portion 133 and inner sidewalls 134. As used herein, when a first element is said to be "connected to" a second element, the first element may be directly connected to the second element, or one or more intervening elements may be present.

After the CMP process for removing portions of first conductive layer 130' is performed, adjacent U-shaped floating gate electrodes 130 are isolated from one another by device isolation pattern 110. In addition, because second opening 22 is wider than first opening 21, the distance between sidewalls 132, which are disposed on sidewalls of second opening 22, is greater than the distance between inner sidewalls 134, which are disposed on sidewalls of first opening 21.

Referring to FIG. 2I, portions of device isolation pattern 110 disposed outside of U-shaped floating gate electrode 130 are etched to form third openings 23. As used herein, when an element is said to be "disposed outside of U-shaped floating gate electrode" 130 it means that the element is not disposed between the outer surfaces of sidewalls 132 of U-shaped floating gate electrode 130. Device isolation pattern 110 is etched using U-shaped floating gate electrode 130 as an etching mask, and device isolation pattern 110 is etched (i.e., recessed) towards the lower surface of substrate 100 such that outer surfaces of sidewalls 132 of U-shaped floating gate electrode 130 are exposed. As illustrated in FIG. 2I, the outer surfaces of sidewalls 132 are exposed while the outer surfaces of inner sidewalls 134 are not exposed, but remain covered by device isolation pattern 110.

Device isolation pattern 110 may be etched such that the bottom surface of third opening 23 and the top surface of active region 12 are substantially level with one another. Alternatively, device isolation pattern 110 may be etched such that the bottom surface of third opening 23 is disposed lower than the top surface of active region 12. As used herein, when a first surface is said to be "lower than the top surface of the active region" it means that the distance in the second direction between the first surface and the lower surface of substrate 100 is less than the distance in the second direction between the top surface of active region 12 and the lower surface of substrate 100. A second conductive layer 150', which will be used to form a control gate, will subsequently be formed to fill third opening 23 (see FIG. 2J). Forming a control gate electrode to the bottom of third opening 23 may substantially prevent adjacent floating gate electrodes from being coupled to one another.

Referring to FIGS. 2I and 2J, a gate interlayer insulating layer 140 is conformally formed on U-shaped floating gate electrode 130, and a second conductive layer 150' is formed on U-shaped floating gate electrode 130. That is, second conductive layer 150', from which control gate electrode 150 will be formed, is formed on both inside and outside surfaces of U-shaped floating gate electrode 130 to improve the coupling ratio of the device by increasing the surface area over which the floating and control gate electrodes overlap. Gate interlayer insulating layer 140 may comprise an oxide/nitride/oxide (ONO) layer or an insulating layer having a high dielectric constant. For example, gate interlayer insulating layer 140 may comprise an insulating metal oxide such as hafnium oxide, aluminum oxide, etc., which may be formed through a CVD process.

Referring to FIGS. 2J and 2K, after second conductive layer 150' is formed, second conductive layer 150' is patterned to form control gate electrode 150. Thereafter, impurity ions are implanted to form a source region S and a drain region D.

The structure and an operational characteristic of a non-volatile memory device fabricated in accordance with the method described above with reference to FIGS. 2A through 2K will now be described with reference to FIGS. 2J and 2K.

Referring to FIG. 2K, gate insulating layer 120 is interposed between active region 12 and floating gate electrode 130, and gate interlayer insulating layer 140 is interposed between floating gate electrode 130 and control gate electrode 150. In addition, source region S and drain region D are disposed in substrate 100 on opposite sides of U-shaped floating gate electrode 130 (and are disposed on opposite sides of control gate electrode 150). Substrate 100, gate insulating layer 120, and floating gate electrode 130 each have intrinsic energy band gaps, and because of the differences between the energy band gaps, potential barriers are formed at the respective interfaces between substrate 100, gate insulating layer 120, and floating gate electrode 130. However, in the nonvolatile memory device illustrated in FIG. 2K, when a voltage is applied such that charge moves from source region S to drain region D, and a voltage is simultaneously induced on floating gate electrode 130, charge moving through the channel region may pass through the potential barrier and accumulate in floating gate electrode 130.

The level of the voltage that is induced on floating gate electrode 130 depends upon an operational voltage applied to control gate electrode 150. Though the operational voltage has a fixed level, the voltage level of the voltage induced on floating gate electrode 130 may be increased in accordance with the coupling ratio between floating gate electrode 130 and control gate electrode 150. In accordance with embodiments of the invention, the surface area over which control gate electrode 150 and floating gate electrode 130 overlap is increased.

Referring to FIG. 2J, U-shaped floating gate electrode 130 comprises inner U-shaped portion 135, wherein the distance between inner sidewalls 134 of inner U-shaped portion 135 is less than the distance between sidewalls 132. In the embodiment illustrated in FIG. 2J, control gate electrode 150 is disposed over active region 12 and comprises an inner portion 154 disposed between sidewalls 132 and inner sidewalls 134. Control gate electrode further comprises an outer portion 152 disposed outside of U-shaped floating gate 130. Additionally, U-shaped floating gate 130 extends in the third direction between source region S and drain region D. Control gate electrode 150 extends in the first direction, which is substantially perpendicular to the third direction, and U-shaped floating gate electrode 130 is formed where control gate electrode 150 and active region 12 intersect.

Control gate electrode 150 overlaps with the inner surface of U-shaped floating gate electrode 130, the outer and top surfaces of sidewalls 132. Therefore, in accordance with an embodiment of the invention, the area over which floating gate electrode 130 overlaps with control gate electrode 150 is greatly increased. As a result, the coupling ratio between U-shaped floating gate electrode 130 and control gate electrode 150 increases, so a higher voltage may be induced on U-shaped floating gate electrode 130 without changing the operational voltage applied to control gate electrode 150.

In the embodiment illustrated in FIG. 2J, inner flat portion 133 is disposed on gate insulating layer 120. As mentioned previously, the distance between sidewalls 132 is greater than the distance between inner sidewalls 134. As a result, the distance in the first direction between outer portion 152 and inner portion 154 of control gate 150 differs in accordance with whether or not the corresponding portion of inner portion 154 is disposed between inner sidewalls 134 or only between sidewalls 132. That is, the distance in the first direction between outer portion 152 and the portion of inner portion 154 disposed on the inner surface of sidewall 132 is greater than the distance in the first direction between outer portion 152 and the portion of inner portion 154 disposed on the inner surface of inner sidewall 134.

The bottom surface of outer portion 152 of control gate electrode 150 may be disposed near the top surface of active region 12. Also, the greater the amount by which the bottom surface of outer portion 152 is formed lower than the top surface of active region 12, the nearer the bottom surface of outer portion 152 is to the lower surface of substrate 100. Although substrate 100 and control gate electrode 150 are insulated from one another by device isolation pattern 110, when the top surface of active region 12 is relatively near the bottom surface of outer portion 152, the electric field formed around control gate electrode 150 may affect the top surface of active region 12 when an operational voltage is applied to control gate electrode 150 in order to program data.

Outer portion 152 of control gate electrode 150 extends into device isolation pattern 110 towards the lower portion of substrate 100 at least so far that the bottom surface of outer portion 152 is substantially level with the top surface of active region 12. When the bottom surface of outer portion 152 is substantially level with the top surface of active region 12, control gate electrode 150 may overlap with U-shaped floating gate electrode 130 along the entire area of the outer surface of sidewall 132. Alternatively, the bottom surface of outer portion 152 may be disposed lower than the top surface of active region 12. Forming control gate electrode 150 such that the bottom surface of outer portion 152 is relatively near the lower surface of substrate 100 is effective in substantially preventing control gate electrode 150 from coupling adjacent U-shaped floating gate electrodes 130.

Therefore, to substantially prevent adjacent U-shaped floating gate electrodes 130 from being coupled to one another, the bottom surface of outer portion 152 is preferably formed lower than the lower surface of substrate 100. However, the nearer the bottom surface of outer portion 152 is formed to the lower surface of substrate 100, the greater is the effect of the electric field formed around control gate electrode 150 on active region 12. In accordance with an embodiment of the invention, second opening 22 was formed such that the distance between the outer surfaces of sidewalls 132, which were previously formed in second opening 22, would be greater than the width of active region 12 by a great enough amount that outer portion 152 would be disposed far enough apart from active region 12 to substantially resolve the previously described problem with forming the bottom surface of outer portion 152 near the lower surface of substrate 100. Accordingly, the bottom surface of outer portion 152 may be formed to be sufficiently lower than the top surface of active region 12 because the electric field due to control gate electrode 150 does not affect active region 12 because of the distance between the outer surface of each sidewall 132 and active region 12. In addition, the distance between the outer surfaces of sidewalls 132 is greater than the width of active region 12 because second opening 22 was previously formed to be wider than active region 12.

In the process for fabricating the nonvolatile memory device in accordance with an embodiment of the invention, when the entire second opening 22 (see FIG. 2E) is etched at once, the bottom corners of second opening 22 may be over-etched. In consideration of that problem, second opening 22 is formed through a plurality of etching processes, as described previously.

Figure 3:
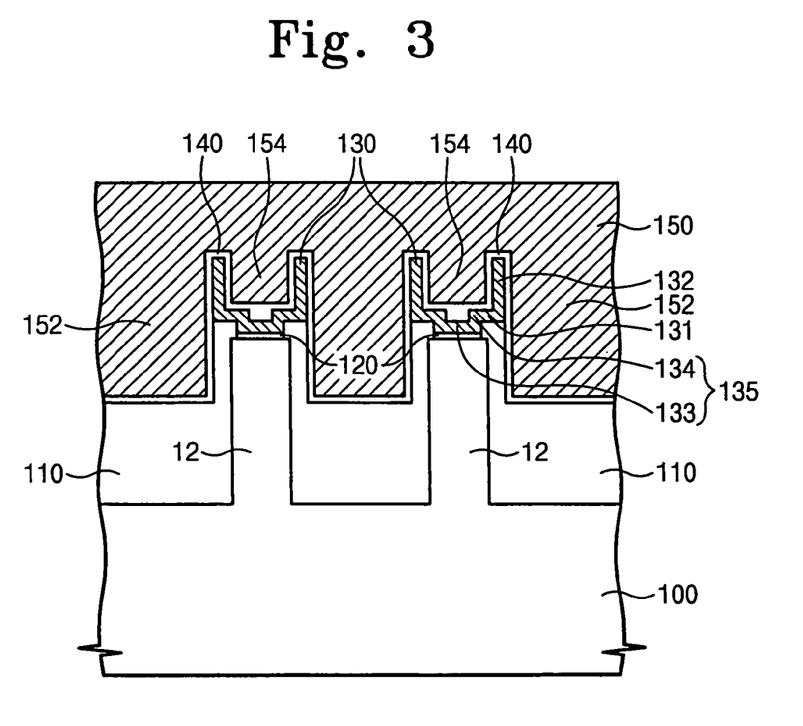
FIG. 3 is a cross-sectional view illustrating a nonvolatile memory device in accordance with an embodiment of the invention; and, FIGS. 4A through 4F are cross-sectional views illustrating a method for fabricating a nonvolatile memory device in accordance with an embodiment of the invention.

FIG. 3 is a cross-sectional view illustrating a nonvolatile memory device in accordance with an embodiment of the invention. Referring to FIG. 3, gate interlayer insulating layer 140 is formed thickly to fill inner U-shaped portion 135, that is, to fill the region disposed between inner sidewalls 134. In the embodiment illustrated in FIG. 3, the distance between the top surface of flat portion 133 and the bottom surface of inner portion 154 of control gate electrode 150 is greater than the corresponding distance in the embodiment illustrated in FIG. 2J, which provides several advantages that will be described subsequently. For instance, when applying different voltages to control gate electrode 150 and substrate 100 when performing an erase operation in the nonvolatile memory device of FIG. 3, charge exits from floating gate electrode 130 because of the electric field caused by the voltage difference between the applied voltages, so a depletion layer with a predetermined thickness is formed in U-shaped floating gate electrode 130. Since the region in which the depletion layer is formed in U-shaped floating gate electrode 130 may be considered a dielectric layer, it is preferable to reduce the thickness of the depletion layer as much as possible. In the embodiment illustrated in FIG. 3, if gate interlayer insulating layer 140 is formed thickly between flat portion 131 and inner portion 154 of control gate electrode 150, the electric field created in accordance with a high voltage applied to control gate electrode 150 may be at least partially offset, so forming gate interlayer insulating layer 140 thickly between flat portion 131 and inner portion 154 is advantageous for reducing the thickness of the depletion layer.

Figure 4A:
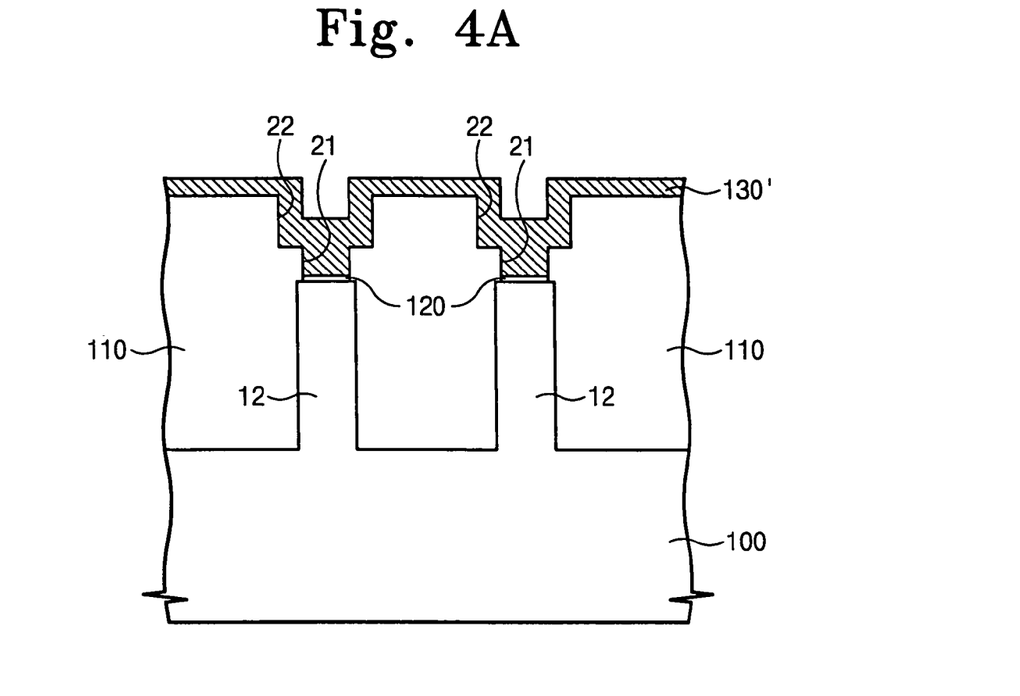
Figure 4B:
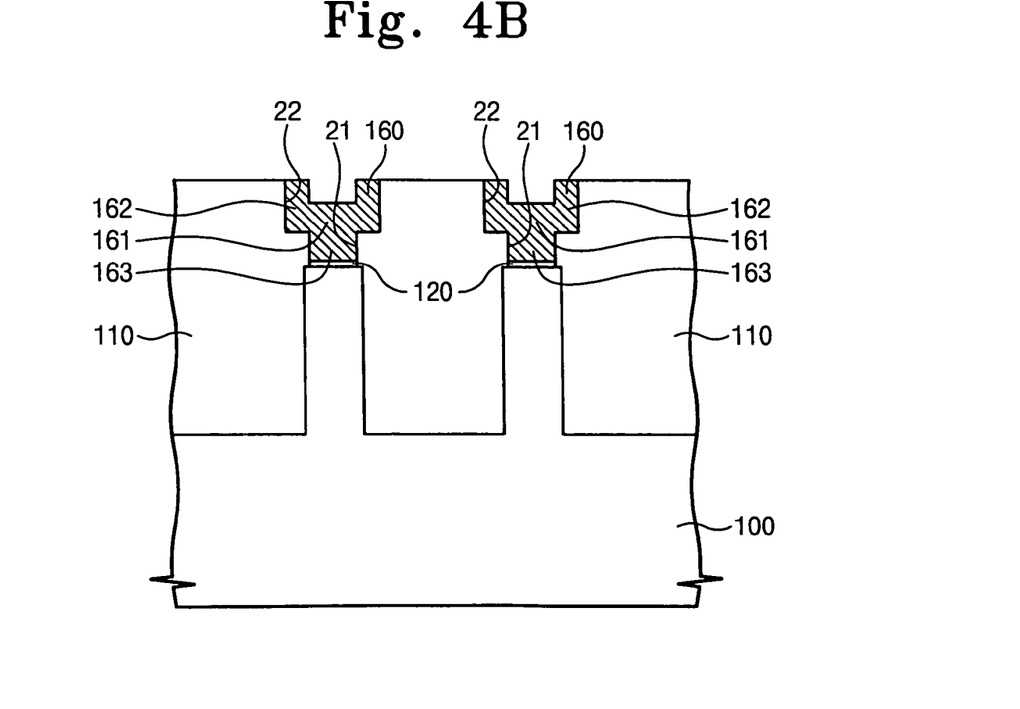
Figure 4C:
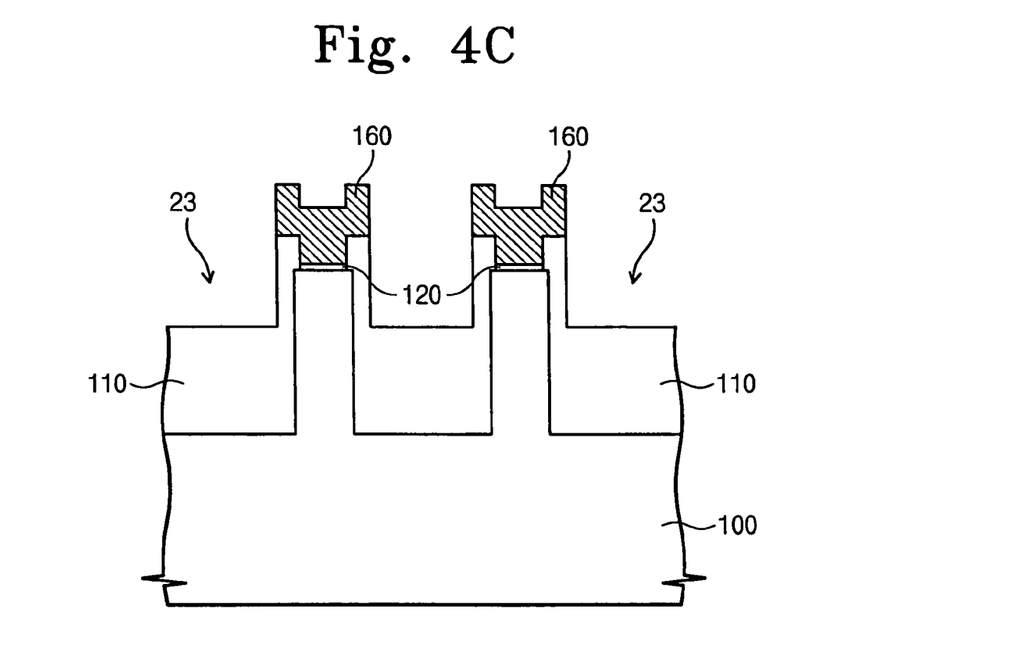
Figure 4D:
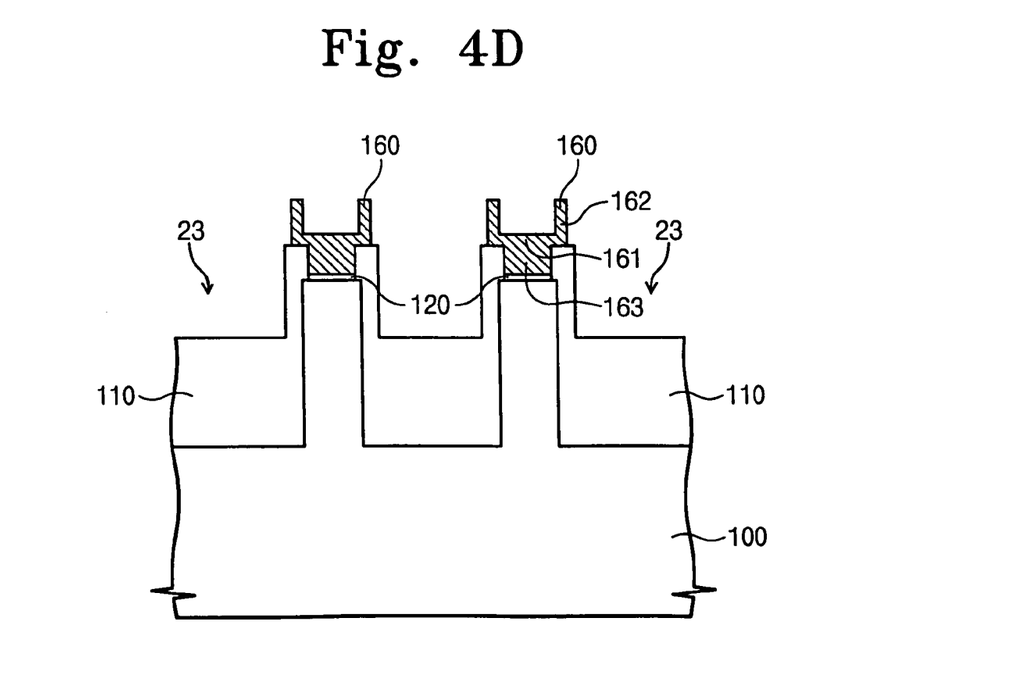
Figure 4E:
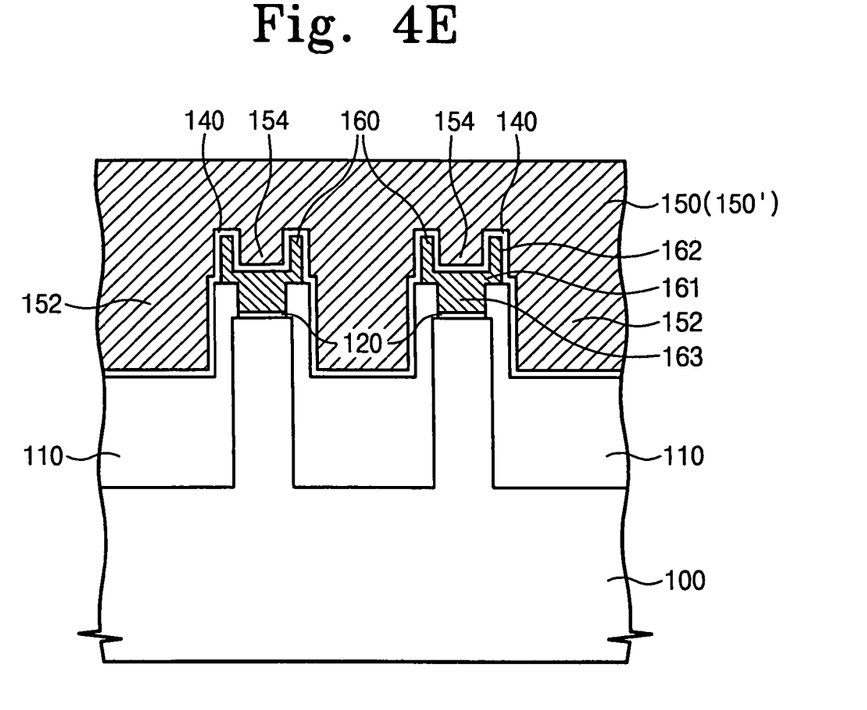
Figure 4F:
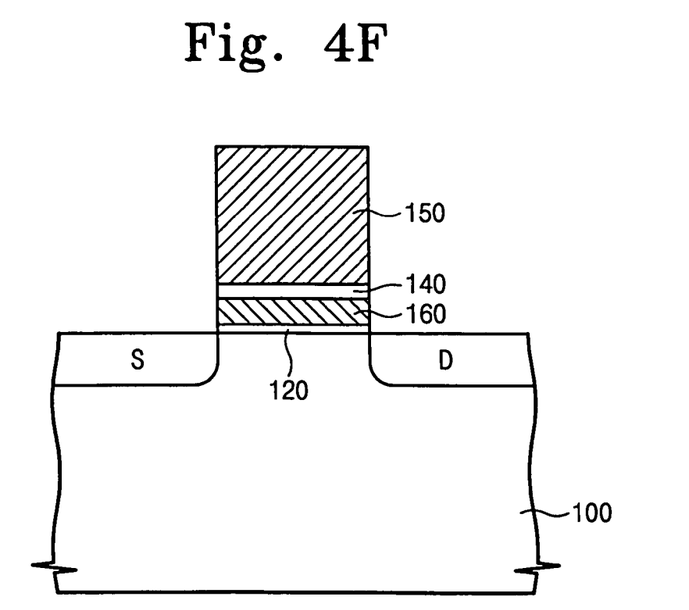

FIGS. 4A through 4F are cross-sectional views illustrating a method for fabricating a nonvolatile memory device in accordance with an embodiment of the invention. FIGS. 4A through 4E are cross-sectional views taken along the first direction, wherein the first direction is substantially parallel to the direction in which control gate electrode 150 extends (see FIG. 4E). In addition, FIG. 4F is a cross-sectional view taken along the third direction, wherein the third direction is substantially perpendicular to the direction in which control gate electrode 150 extends.

First, processes substantially the same as those described with reference to FIGS. 2A through 2F are performed. Through the processes described with reference to FIGS. 2A through 2F, first and second openings 21 and 22 are formed over active region 12 of substrate 100.

Referring to FIG. 4A, after forming a gate insulating layer 120 in first opening 21, a first conductive layer 130' formed from doped polysilicon is deposited over substrate 100. First conductive layer 130' is deposited thickly in order to completely fill first opening 21. For example, if the thickness of first conductive layer 130' is greater than or equal to half the width of first opening 21, first opening 21 may be completely filled by first conductive layer 130', which is deposited on both sidewalls of first opening 21.

Referring to FIG. 4B, portions of first conductive layer 130' are removed. That is, the portions of first conductive layer 130' disposed on the top surface of device isolation pattern 110 are removed, while the portions of first conductive layer 130' disposed in openings 21 and 22 remain intact. Thus, a U-shaped floating gate electrode 160 is formed by removing the portions of first conductive layer 130' that are formed on the upper surface of device isolation pattern 110. The preceding removal process may be performed using a CMP process and, after the CMP process is performed, adjacent U-shaped floating gate electrodes 160 are isolated from one another by device isolation pattern 110. In addition, since first and second openings 21 and 22 have different widths, the width of first conductive layer 130' formed on sidewalls of first opening 21 is smaller than the width of the first conductive layer 130' formed on sidewalls of the second opening 22. U-shaped floating gate 160 comprises flat portion 161, sidewalls 162, and stem portion 163 as the lower portion. Sidewalls 162 are formed on a first side of flat portion 161 and extend in the second direction and stem 163 is formed on a second side of flat portion 161 opposite the first side and extends in the second direction.

Referring to FIG. 4C, portions of device isolation pattern 110 disposed outside of U-shaped floating gate electrode 160 are etched to form third openings 23. Device isolation pattern 110 is etched using U-shaped floating gate electrode 160 as an etching mask. Also, device isolation pattern 110 is etched towards the lower surface of substrate 100 such that the outer surfaces the sidewalls 162 of U-shaped floating gate electrode 160 are exposed. Device isolation pattern 110 may be etched such that the bottom surface of third opening 23 is substantially level with the top surface of active region 12 or such that the bottom surface of third opening 23 is disposed lower than the top surface of active region 12.

Referring to FIG. 4D, U-shaped floating gate electrode 160 is partially etched. U-shaped floating gate electrode 160 is partially etched to create a sufficient amount of space between sidewalls 162 of U-shaped floating gate electrode 160, which is where a conductive layer will be formed subsequently in order to form a control gate electrode 150. That is, U-shaped floating gate electrode 160 is partially etched so that the space between sidewalls 162 is not too narrow after completely filling first opening 21 with first conductive layer 130'.

If the etching process is performed using isotropic wet etching, the inner and outer surfaces of sidewalls 162 are etched simultaneously and the bottom surface of first conductive layer 130' is etched in a second direction towards the top surface of active region 12. Because both inner and outer surfaces of sidewalls 162 are etched during the etching process while only one surface of flat portion 161 is etched during the etching process, the respective widths of sidewalls 162 are reduced by a greater amount than the amount by which the height of flat portion 161 of U-shaped floating gate electrode 160 is reduced. Furthermore, since inner surfaces of sidewalls 162 are each etched in the second direction away from a center point between sidewalls 162, the distance between the inner surfaces of sidewalls 162 increases as a result of the etching process. In addition, because outer surfaces of sidewalls 162 are etched in the second direction towards a center point between sidewalls 162, the distance between the outer surfaces of sidewalls 162 decreases as a result of the etching process. As a result, U-shaped floating gate electrode 160 may be usefully formed, even if the bottom corners of second opening 22 are over-etched.

Referring to FIG. 4E, a gate interlayer insulating layer 140 and a second conductive layer 150' are formed over the resultant structure illustrated in FIG. 4D comprising U-shaped floating gate electrode 160. Gate interlayer insulating layer 140 may comprise an ONO layer formed using a CVD process, and second conductive layer 150' may be formed from doped polysilicon and formed on gate interlayer insulating layer 140.

Referring to FIGS. 4E and 4F, second conductive layer 150' is then patterned to form a control gate electrode 150. Impurity ions are then implanted on opposite sides of U-shaped floating gate electrode 160 to form a source region S and a drain region D.

The structure and an operational characteristic of a nonvolatile memory device fabricated in accordance with the method described above with reference to FIGS. 2A through 2F and 4A through 4F will now be described with reference to FIGS. 4E and 4F.

Referring to FIG. 4E, U-shaped floating gate electrode 160 comprises a stem 163 disposed on gate insulating layer 120, which extends away from flat portion 161 in the second direction; the flat portion 161, which is disposed on stem 163 and extends in the first direction; and a pair of sidewalls 162 that each extend away from flat portion 161 in the second direction. In addition, stem 163 and sidewalls 162 are formed on opposite sides of flat portion 161. Stem 163 is formed from the portion of first conductive layer 130' that fills first opening 21, and flat portion 161 and sidewalls 162 are formed from the portion of first conductive layer 130' formed in second opening 22. Sidewalls 162 of U-shaped floating gate electrode 160 are disposed facing one another, and the distance between the inner surfaces of sidewalls 162 is greater than the width of stem 163.

In addition, the distance between the respective outer surfaces of sidewalls 162 of U-shaped floating gate electrode 160 is greater than the width of active region 12. Therefore, an outer portion 152 of control gate electrode 150, which is adjacent to an outer surface of a sidewall 162 of U-shaped floating gate electrode 160, is disposed far enough apart from active region 12 that the electric field formed around control gate electrode 150 is substantially prevented from reaching active region 12. However, if one etching process is used to form the entire second opening 22 in device isolation pattern 110, gate insulating layer 120 adjacent to the edges of sidewalls 162 may be damaged. However, in accordance with the embodiment illustrated in FIG. 4, gate insulating layer 120 can be substantially protected since sidewalls 162 are separated from active region 12 in the second direction by a distance equal to the height of stem 163, the width of which is narrower than the distance between the inner surfaces of sidewalls 162. Though U-shaped floating gate electrode 160 of FIG. 4 comprises stem 163 rather than inner U-shaped portion 135 like U-shaped floating gate electrode 130 of FIG. 2, U-shaped floating gate electrode 160 is capable of preventing abnormalities in the formation of gate insulating layer 120 like U-shaped floating gate electrode 130 as described above.

It is beneficial that stem 163 has a relatively large height, just as it is beneficial to form gate interlayer insulating layer 140 thickly, as described previously with reference to the illustrated embodiment of FIG. 3. That is, since a depletion layer is formed in U-shaped floating gate electrode 160 during the erase operation of the nonvolatile memory device illustrated in FIG. 4E, U-shaped floating gate electrode 160 is preferably formed with a relatively large height in consideration of the thickness of the depletion layer. In particular, even when a depletion layer is partially formed in U-shaped floating gate electrode 160, it is possible to reduce the effect of the depletion layer during the erase operation if stem 163, which is disposed adjacent to substrate 100, is formed with a sufficient height.

Referring to FIG. 4F, when forming a control gate electrode 150, gate interlayer insulating layer 140 may be etched using a dry etching process. When gate interlayer insulating layer 140 is etched, if U-shaped floating gate electrode 160 is not thick enough, a portion of U-shaped floating gate electrode 160 may be etched and thereby damaged. However, in the embodiment illustrated in FIG. 4, stem 163 of U-shaped floating gate electrode 160 is formed having a relatively large height in a region where gate interlayer insulating layer 140 is etched, so it is possible to substantially prevent these problems.

As described above, in accordance with embodiments of the invention, the area over which the U-shaped floating gate electrode and the control gate electrode overlap is increased, which increases the coupling ratio between a floating gate electrode and a control gate electrode in the nonvolatile memory device. In addition, because of the overall width of the U-shaped floating gate electrode, the control gate electrode is separated from the active region by a distance that is sufficient to substantially prevent an electric field emanating from the control gate electrode from being applied to the active region, even though a high voltage is applied to the control gate electrode. Also, since the flat portion of the U-shaped floating gate electrode is separated in the second direction from the active region by at least a lower portion of the U-shaped floating gate electrode, the problems that may result from over-etching bottom corners of a second opening may be avoided.

Though embodiments of the invention have been described herein, it will be apparent to those skilled in the art that various modifications and variations can be made to the embodiments without departing from the scope of the invention as defined by the accompanying claims.

What is claimed is:

1. A nonvolatile memory device comprising:
    a device isolation pattern disposed on a substrate and adjacent to an active region of the substrate, wherein the device isolation pattern protrudes from the substrate;
    a floating gate electrode disposed on the substrate and comprising a U-shaped lower portion, a first L-shaped upper portion connected to a first side of the U-shaped lower portion, and a second L-shaped upper portion connected to a second side of the U-shaped lower portion;
    a gate interlayer insulating layer formed on the floating gate electrode; and,
    a control gate electrode formed on the gate interlayer insulating layer and the device isolation pattern,
    wherein the control gate electrode comprises an outer portion disposed outside of the floating gate electrode, and wherein a bottom surface of the outer portion is disposed lower than a top portion of the active region.

2. The nonvolatile memory device of claim 1, wherein the gate interlayer insulating layer fills the U-shaped lower portion.

3. The nonvolatile memory device of claim 1, wherein the gate interlayer insulating layer is conformally formed on the floating gate electrode.

4. The nonvolatile memory device of claim 1, wherein the floating gate electrode is formed from doped polysilicon.

5. The nonvolatile memory device of claim 1, wherein:
    the control gate electrode extends in a first direction;
    the floating gate electrode extends in a second direction substantially orthogonal to the first direction; and,
    the control gate electrode intersects with the floating gate electrode.

* * * * *